June 13, 1961 R. K. RICHARDS 2,988,651

REGENERATIVE PULSE AMPLIFIER

Filed Aug. 30, 1957

REGENERATIVE PULSE AMPLIFIER 8

REGENERATIVE PULSE AMPLIFIER 8'

REGENERATIVE PULSE AMPLIFIER 8"

INVENTOR.
RICHARD K. RICHARDS

BY S.C. Yuter

ATTORNEY 2,988,651
Patented June 13, 1961

2,988,651

REGENERATIVE PULSE AMPLIFIER

Richard K. Richards, Old Troy Road,
Wappingers Falls, N.Y.

Filed Aug. 30, 1957, Ser. No. 681,332
16 Claims. (Cl. 307—88.5)

Figure 1:
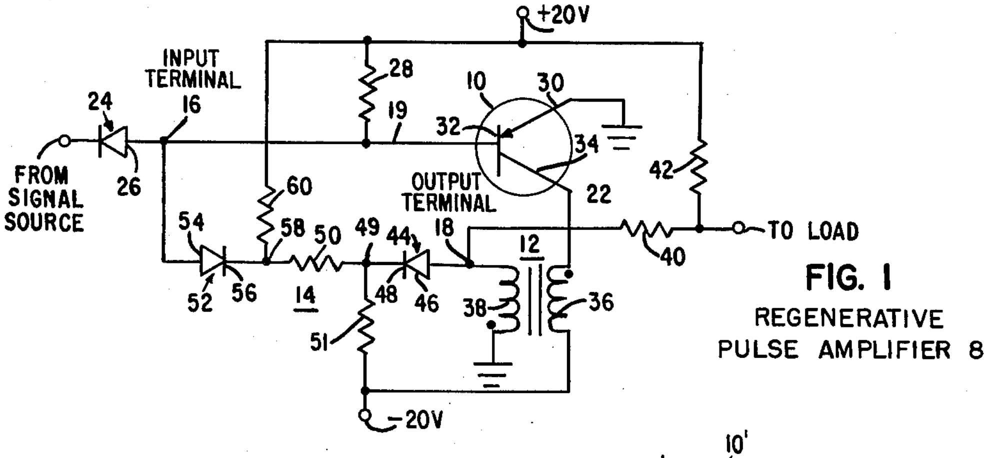

This invention relates to signal amplification and more particularly the regenerative amplification of pulse signals.

Pulse amplifiers have many applications in fields which employ digital techniques such as radar, telemetering and digital computing. In these fields, and particularly in digital computing, passive circuits attenuate and distort the pulse signals. For example, some of the circuits of necessity have a limited band width which introduces distortion. One of the more serious type of distortion is the attenuation of the high frequency components of the transmitted pulse signals. The loss of high frequency components results in a rounding of the leading and trailing edges of the pulse signals. Not only do interconnecting circuits in a pulse amplifier chain attenuate and distort the transmitted pulse signals, but also some of the newly developed amplifying elements have low input impedances which affect the amplitude and shape of the pulse signals.

To overcome these attenuations and distortions regenerative pulse amplifiers have been developed. These regenerative pulse amplifiers basically rely on the incoming signal only to initiate the amplifier action. As the amplifier starts transmitting an amplified signal in response to an input signal, the amplified signal is fed back from the output terminal of the amplifier to the input terminal of the amplifier to enhance the magnitude of, and even replace, the input signal. The action becomes cumulative resulting in a sharp edged amplified pulse signal being transmitted.

Often in digital applications the waveforms of the transmitted pulse signals need not be amplified duplicates of the input pulse signals. The pulse amplifier is only required to produce a pulse signal whenever a pulse signal is received at its input terminal. Usually the relaxation of the requirement on waveshape is replaced by the requirement that each pulse amplifier be capable of driving several other pulse amplifiers and their associated input networks. Even when the input impedances of the driven amplifiers is high, such as those associated with the control grid circuits of vacuum tube amplifiers, there is a considerable drain on the available generated energy by each of the loading amplifiers. Furthermore, when transistors are substituted for vacuum tubes the drain becomes critical. Therefore, in these applications, use is made of regenerative pulse amplifiers in which a part of the energy from the output terminal is returned to the input terminal in such a manner that it is only necessary for the input signal to initiate the pulse amplification process and the feedback means supplies the major portion of the required input energy.

In the digital computer art, one of the more common of these regenerative pulse amplifiers employs an output transformer as an output means to provide current amplification for activating the networks of diode gating circuits associated with the input stages of succeeding amplifiers. It has been found with many of these regenerative pulse amplifiers that the feedback energy is often uncontrollably large. In some cases clamping techniques which require special voltage supplies and additional diodes have been employed to limit the feedback energy. In other cases special feedback windings are incorporated in the output transformer. In still other cases a combination of these two approaches is used. Although clamping techniques are helpful, they are usually expensive and difficult to realize particularly where transistors are used as the amplifying means. Since transistors operate at signal levels in the range of one or two volts, the special voltages used in the clamping techniques are often in the one volt range. Regulated power supplies for producing such voltages are extremely complex and expensive. Further, extra windings on the output transformers present manufacturing difficulties particularly when the pulses being handled have widths which approach the microsecond range. Any extra windings in the pulse transformers add undesirable reactance parameters which adversely affect pulse shape.

It is therefore the general object of the invention to provide an improved signal amplifier.

It is another object of the invention to provide an improved regenerative pulse amplifier in which the number of voltage supplies required is minimized.

It is a further object of the invention to provide an improved regenerative amplifier which requires none of the common clamping techniques for controlling signal amplitude.

It is yet another object of the invention to provide an improved regenerative pulse amplifier employing an output transformer which requires no separate feedback winding.

In accordance with one embodiment of the invention a regenerative signal amplifier is provided having an input means for receiving pulse signals to be amplified, an amplifying means which responds to the input means to amplify received signals, and an output means which responds to the amplifying means to transmit amplified signals. A feedback means couples the output means to the input means. The feedback means includes a first diode, a resistor and a second diode connected in a serial manner. The first diode is so disposed and responsive to a first potential establishing means to permit transmission of signals from the resistor to the input means. The second diode is conductive in response to a second potential establishing means and the output means during the quiescent or non-amplifying state of the regenerative pulse amplifier. However, at the beginning of the amplifying state the second diode remains conductive and a portion of the output energy is fed back from the output means via the resistor to the input means. Thereafter, the second diode becomes nonconductive in response to the output means to prevent the feeding back of energy and all the output energy is then available to a load.

It should be noted that the feedback means requires at most two sources of potential. In the digital computing are these two sources of potential are normally supplied for the diode gating networks that interpose the regenerative pulse amplifiers; therefore no new potential sources are required. It should also be noted that the feedback means requires only two diodes. Normally, two such diodes are employed in regenerative pulse amplifiers in addition to several clamping diodes so that the invention requires fewer diodes and therefore the circuitry is simpler and less expensive.

Another advantage of the invention is that the load on the signal source which feeds the input means is minimized since the signal source is only required to initiate the amplifying action because of the operation of the feedback means.

Other advantages of the invention are that it may be used in systems employing a relatively high pulse repetition rate since the inductance of the output means may be minimized, and it is readily adaptable to logical functions of the type used in digital computers.

Figure 2:
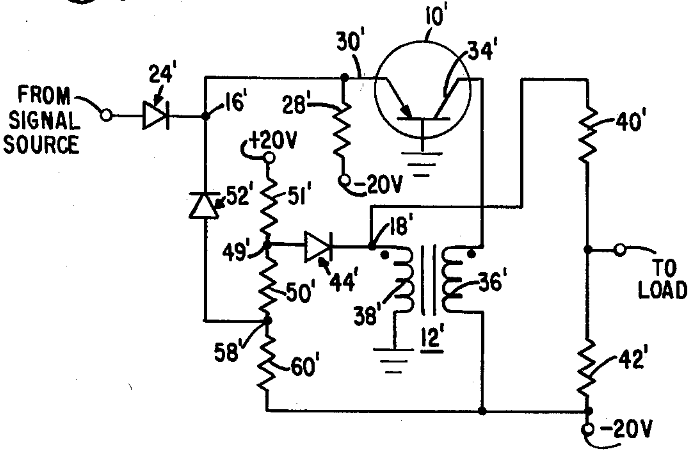
Figure 3:
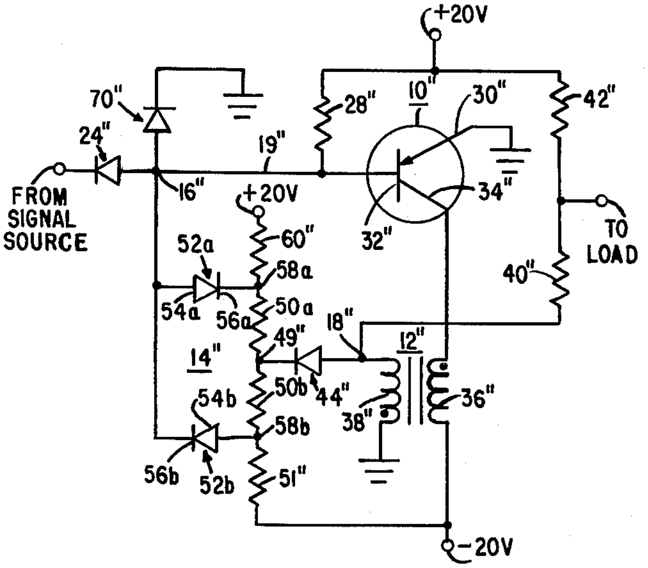

Other objects, features and advantages of the invention will be evident from the following detailed description and the accompanying drawings wherein:

FIGURE 1 shows the circuit of a regenerative pulse amplifier employing a transistor with base input and including a feedback means, in accordance with a preferred embodiment of the invention, FIGURE 2 shows the circuit of a regenerative pulse amplifier in which the emitter of the transistor receives signals for amplification, in accordance with another embodiment of the invention, and FIGURE 3 shows the circuit of a regenerative pulse amplifier of the transistor type whose feedback means includes two branches, in accordance with still another embodiment of the invention.

Referring to FIGURE 1, a regenerative pulse amplifier 8 is shown comprising the transistor 10, the pulse transformer 12, the feedback means 14, the input terminal 16, and the output terminal 18. Pulses for amplification are received at the input terminal 16 and transmitted via the line 19 to the transistor 10. The transistor 10 is coupled to the pulse transformer 12 by the line 22 and the amplified pulse appears at the output terminal 18. A portion of the amplified pulse is fed back via the feedback means 14 to the input terminal 16 to supply added input energy to enhance the input pulse signal. The input terminal 16 may be termed input means and the output terminal 18 may be termed output means.

More specifically, the input terminal 16 is linked to a signal source (not shown) by the diode 24 whose anode 26 is connected to the input terminal 16. The resistor 28 links the line 19 to a positive twenty volt potential. The line 19 is quiescently at slightly above ground potential, as will be apparent later.

The transistor 10, a PNP type, has a grounded emitter 30, a base 32 connected to the line 19, and a collector 34. Quiescently (i.e., during the non-amplifying state), the base 32 is essentially at slightly positive potential and the transistor 10 is cut off. This will likewise be apparent later.

The pulse transformer 12 has a primary winding 36 and a secondary winding 38. The primary winding 36 has one end connected to the line 22 and the other end to a negative potential of twenty volts for supplying conduction current when the transistor 10 is amplifying. One end of the secondary winding 38 is grounded while the other end is connected to the output terminal 18. In accordance with the dot convention shown, when there is an increase in current flow through the primary winding 36 a negative pulse appears at the output terminal 18.

The output terminal 18 is connected via the resistor 40 to the load (not shown) and via the resistors 40 and 42 to the positive twenty volt potential. Thus, quiescently, due to the low D.C. resistance of the secondary winding 38, the output terminal 18 is substantially at ground potential.

The feedback means which couples the output terminal 18 to the input terminal 16 comprises the diode 44, the resistor 50 and the diode 52 serially disposed. The anode 46 of the diode 44 is connected to the output terminal 18, while its cathode 48 is connected to the junction 49. Resistor 50 is connected between junctions 49 and 58. The anode 54 of diode 52 is connected to input terminal 16 while the cathode 56 is connected to junction 58. Resistor 51 is connected between the negative twenty volt potential and junction 49. Resistor 60 is connected between the positive twenty volt potential and junction 58. The resistance of resistor 51 is sufficiently low relative to the resistance of resistors 50, 60, and 28 that the potential of junction 49 is tended to be pulled in a negative direction. However, because of the low impedance path to ground afforded by diode 44 and the secondary winding 38, the potential of junction 49 is maintained substantially at ground potential in the quiescent condition. The relative resistances of resistors 50 and 60 are so chosen that the potential of junction 58 is slightly positive with respect to ground. The potential at input terminal 16 (line 19, base 32) is still slightly more positive with respect to ground in view of the following considerations. Transistor 10 is quiescently cut off, tending to place line 19 at full plus twenty volt potential (through resistor 28). However, diode 52, poled in the manner shown, interconnects terminals 16 and 58. Terminal 16 is, therefore, at a potential more positive with respect to ground than terminal 58 by the small potential drop through diode 52. The diodes 44 and 54 may be termed unidirectional signal transfer elements and the resistor 50 may be termed a bidirectional signal element.

The operation of the regenerative pulse amplifier 8 will now be described.

A negative going pulse signal is transmitted through the diode 24 causing the potential of the input terminal 16 to start dropping below ground potential. As the base 32 senses the negative going transient, the transistor 10 following the usual transistor action starts to conduct. This results in a current flow in the primary winding 36 which, because of the phasing of the windings, causes the potential of the output terminal 18 to drop below ground to a lower potential. The potential of the junction 49 therefore falls to this lower potential due to the influence of the resistor 51 coupled to the negative twenty volt potential. The negative going transient is transmitted by the resistor 50 to the junction 58 which also begins a negative excursion. The potential of the junction 58 is transmitted through the diode 52 to the input terminal 16 to further depress the potential of the line 19. The potential depression now becomes cumulative until the potential of the output terminal 18 attains a negative value which the junction 49 cannot follow. It should be noted that the resistors 50, 51 and 60 form a potential divider which can limit the potential excursions of the junctions 49 and 58. When the negative potential limit is reached the diode 44 stops conducting and the feedback means 14 is disconnected from the output terminal 18. All the energy in the negative potential pulse is then available for transmission via the resistor 40 to the load.

After a period of time which is a function of the primary inductance of the transformer and the impedance of the load, the negative potential at the output terminal 18 starts rising until ground potential is reached. There may be a positive potential transient above ground resulting from the stored energy in the field established in the pulse transformer. Some of the energy will be dissipated in the load and some in the resistor 51. Finally, the regenerative pulse amplifier 8 settles down to its quiescent state to await the reception of another pulse signal.

Several advantages of the invention which are helpful in some critical design conditions should be noted. In the quiescent state, the current through the secondary winding 38 can approach zero by a proper choice of the resistors 40, 42 and 51, with respect to other resistors in the circuit; thus finer wire can be used in the winding. Alternatively, it is possible to select sufficiently low resistance values for resistors 40 and 42 to cause the net quiescent current in the secondary winding 38 to be in the direction which creates transformer flux in the direction opposite to the direction of flux created by current in the primary winding 36. Thus, by utilizing flux changes in both directions with respect to zero flux in the transformer, the use of a smaller core is permitted without the possibility of saturating the core.

It should also be noted that resistors 40 and 42 bias the output line to a small positive potential suitable for supplying input pulses to a succeeding regenerative pulse amplifier. By an appropriate choice of these resistors it is possible to establish a bias which causes substantially no energy to be supplied to the load until the diode 44 disconnects.

FIGURE 2 shows the circuit of the regenerative pulse amplifier 8' which is similar to the regenerative pulse amplifier 8 shown in FIGURE 1, and corresponding components are indicated by the same reference characters but with a prime designation added. The regenerative pulse amplifier 8' employs a transistor 10' having its emitter 30' as transistor input terminal. Except for the reorientation of the terminals of the transistor, a reversal of the polarities of the diodes and corresponding reversal of the supply potentials, the circuit is the same. Since the current gain for this type of transistor input is low, there is a compensating change in the turns ratio of the windings of the transformer 12'.

The circuit of the regenerative pulse amplifier 8' has been arranged to emphasize a feature of the invention. The resistors 50', 51' and 60' constitute a potential divider with the diode 44', in general though not necessarily, quiescently in a state of conduction, connecting the output terminal 18' to the junction 49' and the diode 52', quiescently in a state of nonconduction, connecting the input terminal 16' to the junction 58'.

The operation of the regenerative pulse amplifier 8' is similar to the operation of the regenerative pulse amplifier 8 except that positive going pulse signals swinging up from ground potential are used throughout.

In some digital applications the repetition rate of the pulse signals is great enough so that any effect which prevents a prompt return to the quiescent state, such as the overshoot at the end of the pulse signal due to stored energy in the pulse transformer, cannot be tolerated. The regenerative pulse amplifier 8'' shown in FIGURE 3 permits a rapid turning off at the end of the pulse signal.

The circuit of the regenerative amplifier 8'' is in many respects similar to the circuit of the regenerative amplifier 8 of FIGURE 1, and corresponding components are identified by the same reference character but with a double prime designation added. However, the feedback means 14'' of FIGURE 3 is divided into two branches and the clamping diode 70'' is connected between the input terminal 16'' and ground. The junction 49'' is coupled to the input terminal 16'' by a first or upper branch comprising the serially disposed resistor **50*a* and the diode 52*a*, and by a second or lower branch comprising the serially disposed resistor 50*b* and the diode 52*b*. The anode 54*a* of the diode 52*a* is connected to input terminal 16'' and its cathode 56*a* to the junction 58*a*. The junction 58*a* is quiescently maintained at a positive potential with respect to ground by means of the resistor 60'' coupled to the positive twenty volt potential. The cathode 56*b* of the diode 52*b* is connected to the input terminal 16'' and its anode 54*b* to junction 58*b*. The junction 58*b* is maintained quiescently at a negative potential by means of the resistor 51''** coupled to the negative twenty volt potential.

During the quiescent state the input terminal 16'' is approximately at ground potential and the diodes **52*a* and 52*b*** are not conducting and appear as high impedance elements.

The operation of the regenerative pulse amplifier 8'' is similar to the operation of the regenerative pulse amplifier 8 of FIGURE 1 which has been previously discussed. Therefore, only the differences in operation will be indicated.

The leading edge of the negative going pulse which is fed to the input terminal 16'' via the diode 24'' causes a negative potential to appear at the output terminal 18'' which causes the potential of the junction 49'' to fall. The junctions **58*a* and 58*b* follow the fall. A negative potential at the junction 58*a* causes conduction by the diode 52*a* and the negative potential is fed back to the input terminal 16'' and regenerative feedback is started. The upper branch is operative during the start of pulse amplification. It should be noted that at this time the junction 58*b* is only driven further negative and the diode 52*b* remains nonconductive and is effectively out of the circuit. However, at the end of the pulse amplification period the output terminal 18'' starts swinging in a positive direction followed by the junction 49''. The positive swing is transmitted to the junction 58*a* and the diode 52*a* stops conducting and cuts off. However, the positive transient passes from the junction 58*b* through the diode 52*b* which starts conducting to raise the potential of the input terminal 16''. The effect becomes cumulative until the base 32'' of the transistor 10''** returns to ground potential. Thus the lower branch is operative during the termination of the pulse signal amplification period.

It should be noted that several advantages accrue from providing two feedback branches. When the negative feedback pulse is being terminated the positive potential swing is fed from the junction 49'' to the junction **58*b*, through the diode 52*b* to the input terminal 16'' to cut off the transistor 10'' promptly. The circuit is made ready earlier for another pulse amplification operation and a higher pulse repetition rate is possible. Secondly, since the positive going signal at the trailing edge is fed to the line 19'' by the diode 52*b*, the resistor 28'' may be very large (or eliminated). A large value for the resistance 28'' is desirable for it is part of the load on the input pulse signal. Thirdly, by the addition of the diode 70'' which prevents the input terminal 16'' from swinging above ground, the transformer 12''** is damped and no oscillations or positive overshoots occur.

It should be noted that no specific input circuits are described since any one of the conventional input circuits may be used and in particular the diode gating circuits associated with digital computer logic are especially applicable.

It will be recalled that the grounded emitter arrangement of FIGURE 1 is suitable for reception of negative input signals from the signal source. The grounded base arrangement of FIGURE 2 is suitable for reception of positive input signals, and has operating potentials and diodes inverted with respect to FIGURE 1. The operating potentials and diodes of FIGURE 3 may similarly me inverted, and transistor 10'' arranged grounded base, for the purpose of reception of positive input signals.

It should also be noted that conventional clock pulse techniques of the serial digital computer art may be used to terminate the amplification. For example, a diode may be used to connect the junction 49 to a clock pulse source, the diode being so polarized to permit a positive going clock pulse to override the negative feedback pulse for terminating the feedback action at a desired time.

Although the shown embodiments are for PNP junction transistors, NPN junction transistors and point-contact transistors may be used, as well as vacuum tubes and other types of amplifying means. The appropriate modifications in potential polarities and amplification adjustments are well known and are easily accomplished by those skilled in the art.

It should also be noted that ideal diodes were assumed, but the circuits perform as well with diodes having finite resistance values. Likewise, the potentials of the supply voltages are purely representative and other supply voltages may be used.

Thus, in accordance with the invention, several embodiments of a regenerative pulse amplifier have been provided which are relatively simple and inexpensive, which minimize the load on the input and output circuitry, and which require a minimum of supply voltages, circuit components and no clamping voltages. In addition, the design and fabrication of the output circuitry usually associated with this type of regenerative pulse amplifier is simplified because a separate feedback winding is not required. Further, the invention is readily adaptable to logical functions of the type used in digital computers and to relatively high pulse repetition rates.

There will now be obvious to those skilled in the art many modifications and variations utilizing the principles set forth and realizing many or all of the objects and advantages of the circuits described but which do not depart essentially from the spirit of the invention.

What is claimed is:

1. A signal amplifier comprising input means for receiving signals to be amplified, amplifying means responsive to said input means for amplifying the received signals, output means responsive to said amplifying means for transmitting amplified signals, a potential divider having first and second intermediate junctions, a first unidirectional signal transmitting means coupling said output means to the first intermediate junction of said potential divider and a second unidirectional signal transmitting means coupling said input means to the second intermediate junction of said potential divider, said potential divider and said first and second unidirectional signal transmitting means being a regenerative feedback means for regeneratively feeding back a portion of the amplified signal from said output means to said input means.

2. A regenerative pulse signal amplifier for transmitting pulse signals comprising an input means for receiving pulse signals to be amplified, an amplifying means responsive to said input means for amplifying the received signals, an output means responsive to said amplifying means for transmitting the amplified signals, a potential divider, a first diode coupling said potential divider to said output means, means for biasing said first diode conductive during the quiescent state of said output means and nonconductive during the transmitting state of said output means, a second diode coupling said potential divider to said input means, and means for biasing said second diode to transmit signals from said potential divider to said input means for regeneratively feeding back a portion of the amplified pulse signal from said output means to said input means.

3. A regenerative pulse signal amplifier for transmitting amplified pulse signals from a source to a load comprising a first junction, a first diode coupling said signal source to said first junction, a first source of potential, a first resistor coupling said first junction to said first source of potetntial, amplifying means having an input terminal, an output terminal and a grounded terminal, said input terminal being connected to said first junction, a transformer having a primary and a grounded secondary winding, a second source of potential, one end of said primary winding being coupled to said second source of potential, the other end of said primary winding being coupled to the output terminal of said amplifying means, a second junction, the ungrounded end of said secondary winding being connected to said second junction, second and third resistors serially disposed to connect said second junction to said first source of potential, the junction of said second and third resistors being coupled to the load, fourth, fifth and sixth resistors serially disposed between said first and said second sources of potential, a second diode connecting said second junction and the junction of said fourth and fifth resistors, and a third diode connecting said first junction and the junction of said fifth and sixth resistors, said fifth resistor, said second diode and said third diode providing a feedback path for feeding back signals from said second junction to said first junction.

4. The apparatus of claim 3 wherein said amplifying means comprises a transistor and the input terminal is the base, the output terminal the collector, and the grounded terminal the emitter.

5. The apparatus of claim 3 wherein said amplifying means comprises a transistor and the input terminal is the emitter, the output terminal the collector, and the grounded terminal the base.

6. A signal amplifier comprising an input means for receiving signals to be amplified, an amplifying means for amplifying the received signals, an output means for transmitting the amplified signals, and feedback means for feeding back signals from said output means to said input means, said feedback means having a first branch and a second branch, said first branch including a first bidirectional signal transmission means and a first unidirectional signal transmission means disposed serially, said second branch including a second bidirectional signal transmission means and a second unidirectional signal transmission disposed serially, said first and second unidirectional signal transmission means being oppositely poled so that said first and second branches feed back different portions of the signals transmitted from said output means.

7. A regenerating signal amplifier comprising input means for receiving signals to be amplified, amplifying means for amplifying received signals, output means for transmitting amplified signals, a feedback means, and a first diode coupling one end of said feedback means to said output means, the other end of said feedback means being coupled to said input means, said feedback means having a first branch including a first resistor and second diode serially disposed and a second branch including a second resistor and a third diode serially disposed, said first and second branches being in parallel relationship, and said second and third diodes being oppositely poled so that said first and second branches feed back different portions of a signal amplified by said regenerative signal amplifier.

8. The apparatus of claim 7 wherein said amplifying means comprises a transistor and said output means comprises an output transformer.

9. A regenerative pulse amplifier comprising an input means, an amplifying means responsive to said input means, an output means responsive to said amplifying means, a potential divider having first, second and third junctions, a first diode connecting said output means to the first junction of said potential divider, a second diode connecting the second junction of said potential divider to said input means, and a third diode connecting the third junction of said potential divider to said input means, said second and third diodes being oppositely poled to permit regenerative feedback via said second diode during the start of pulse amplification and to permit regenerative feedback via said third diode during the termination of pulse amplification.

10. A regenerative pulse amplifier for transmitting amplified pulse signals from a signal source to a load comprising a first junction, a first diode coupling said signal source to said first junction, a first source of potential, a first resistor coupling said first junction to said first source of potential, a transistor having an input terminal, an output terminal and a grounded terminal, said input terminal being connected to said first junction, a transformer having a primary winding and a grounded secondary winding, a second source of potential, one end of said primary winding being coupled to said second source of potential, the other end of said primary winding being coupled to the output terminal of said transistor, a second junction, the ungrounded end of said secondary winding being coupled to said second junction, second and third resistors serially disposed to connect said second junction to said first source of potential, the junction of said second and third resistors being coupled to the load, fourth, fifth, sixth and seventh resistors serially disposed between said first and second sources of potential, a second diode connecting the junction of said fifth and sixth resistors to said second junction, a third diode connecting the junction of said fourth and fifth resistors to said first junction, and a fourth diode connecting the junction of said sixth and seventh resistors to said first junction, said third and fourth diodes being oppositely poled to permit regenerative feedback via a circuit which includes said third diode at the start of pulse amplification and regenerative feedback via a circuit which includes said fourth diode during the termination of pulse amplification.

11. The apparatus of claim 10 wherein the input terminal of said transistor is the base, the output terminal the collector, and the grounded terminal the emitter.

12. The apparatus of claim 10 wherein the input terminal of said transistor is the emitter, the output terminal the collector, and the grounded terminal the base.

13. A regenerative pulse signal amplifier comprising an input means for receiving pulse signals for amplification, an amplifying means responsive to said input means for amplifying received pulse signals, an output means responsive to said amplifying means for transmitting amplified pulse signals, a regenerative feedback means coupling said output means to said input means for feeding back amplified pulse signals from said output means to said input means, said regenerative feedback means including a first diode, a resistor and a second diode in serial relation in that order, means for coupling said first diode to said input means, means for coupling said second diode to said output means, means for biasing said second diode conductive to feed back one portion of the amplified signal to said resistor and nonconductive in response to said output means to prevent the feeding back of another portion of the amplified pulse signal to said resistor, and means for biasing said first diode to transmit signals from said resistor to said input means.

14. The apparatus of claim 13 wherein said amplifying means includes a transistor and said output means includes a transformer having a primary winding and a secondary winding wherein one electrode of said transistor is coupled to said primary winding and said regenerative feedback means is coupled to said secondary winding.

15. A signal amplifier comprising input means for receiving signals to be amplified, amplifying means responsive to said input means for amplifying the received signals, output means responsive to said amplifying means for transmitting amplified signals, a source of potential having first and second output terminals at different potentials, a potential divider having first and second input terminals coupled respectively to the first and second output terminals of said source of potential, said potential divider having first and second intermediate junctions, a first unidirectional signal transmitting means coupling said output means to said first intermediate junction, and a second unidirectional signal transmitting means coupling said input means to said second intermediate junction, said source of potential, said potential divider and said first and second unidirectional signal transmitting means comprising a regenerative feedback means for feeding back a portion of the amplified signal from said output means to said input means.

16. A signal amplifier comprising input means for receiving signals to be amplified, amplifying means responsive to said input means for amplifying the received signals, output means responsive to said amplifying means for transmitting amplified signals, a source of potential having first and second terminals at different potentials, first, second and third resistance means serially coupled between said first and second terminals, a first unidirectional signal transmitting means coupling said output means to the junction of said first and second resistance means, and a second unidirectional signal transmitting means coupling said input means to the junction of said second and third resistance means, said source of potential, said resistance means and said unidirectional signal transmitting means comprising a regenerative feedback means for feeding back a portion of the amplified signal from said output means to said input means.

References Cited in the file of this patent

UNITED STATES PATENTS

| | | |
|---|---|---|
| 2,144,995 | Pulvermacher | Jan. 24, 1939 |
| 2,554,905 | Hawkins et al. | May 29, 1951 |
| 2,764,688 | Grayson et al. | Sept. 25, 1956 |
| 2,782,311 | Colander et al. | Feb. 19, 1957 |
| 2,802,118 | Simkins | Aug. 6, 1957 |
| 2,835,828 | Vogelsong | May 20, 1958 |
| 2,840,727 | Guggi | June 24, 1958 |
| 2,888,560 | Talambiras | May 26, 1959 |
| 2,889,510 | Carmichael | June 2, 1959 |
| 2,899,553 | Horton | Aug. 11, 1959 |